(12) United States Patent
Kwon

(10) Patent No.: US 6,583,054 B2
(45) Date of Patent: *Jun. 24, 2003

(54) METHOD FOR FORMING CONDUCTIVE LINE IN SEMICONDUCTOR DEVICE

(75) Inventor: Tae-Seok Kwon, Chungcheongbuk-do (KR)

(73) Assignee: Hyundai Microelectronics Co., Ltd., Chungcheongbuk-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,092

(22) Filed: Oct. 19, 1999

(65) Prior Publication Data

US 2002/0064939 A1 May 30, 2002

(30) Foreign Application Priority Data

Feb. 22, 1999 (KR) ............................................. 1999-5794

(51) Int. Cl.[7] .................. H01L 21/4763; H01L 21/302; H01L 21/469
(52) U.S. Cl. ...................... 438/638; 438/624; 438/627; 438/706; 438/786
(58) Field of Search ................................ 438/622–624, 438/627, 629, 631, 633, 637–640, 700, 706, 786, 791

(56) References Cited

U.S. PATENT DOCUMENTS

| | | | |
|---|---|---|---|
| 5,407,870 A | 4/1995 | Okada et al. ................ 437/241 |
| 5,719,081 A | 2/1998 | Racanelli et al. ............ 438/290 |
| 5,801,099 A * | 9/1998 | Kim et al. .................... 438/666 |
| 5,973,348 A * | 10/1999 | Ishibashi ..................... 257/306 |
| 6,054,377 A * | 4/2000 | Filipiak et al. .............. 438/619 |
| 6,063,711 A * | 5/2000 | Chao et al. .................. 438/724 |
| 6,228,758 B1 * | 5/2001 | Pellerin et al. | |

* cited by examiner

Primary Examiner—Ha Tran Nguyen
(74) Attorney, Agent, or Firm—Morgan, Lewis & Bockius LLP

(57) ABSTRACT

Provided with a method for forming conductive lines in a semiconductor device including the steps of: (a) forming a first conductive line on a substrate; (b) forming a first insulating layer on the substrate as well as on the first conductive line; (c) etching the first insulating layer on the first conductive line to form a first opening; (d) forming a second insulating layer on the first insulating layer to be in contact with the upper part of the first opening, thereby sealing the first opening; (e) etching the first and second insulating layers corresponding to the first conductive line to form a second opening and at the same time extend the first opening so as to expose the first conductive line; and (f) forming a second conductive line within the first and second openings so as to be connected with the first conductive line, thereby preventing halation caused by irregular reflection during exposure on the second photo resist because the second insulating layer has a less difference in thickness, and suppressing decrease in the exposed area of the first conductive line caused by extension of the first opening.

11 Claims, 4 Drawing Sheets

METHOD FOR FORMING CONDUCTIVE LINE IN SEMICONDUCTOR DEVICE

BACKGROUND OF THE INVENTION

1. Field of the Invention

Figure 1A:
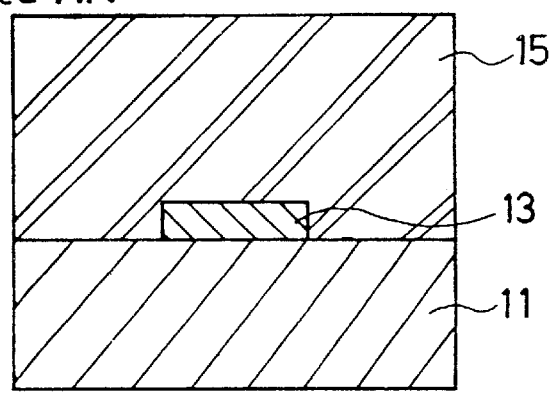

The present invention relates to a method for fabricating a semiconductor device and, more particularly, to a method for forming conductive lines in a semiconductor device in which a trench for forming the upper conductive line is overlapped with contact holes for exposing the lower conductive line, the trench being filled with a conductive metal to form the upper conductive line.

2. Discussion of Related Art

As a material for the conductive lines in a semiconductor device, there has been widely used aluminum or aluminum alloy film which are easy to provide formation of pattern through dry etch and relatively inexpensive with high electrical conductivity and good adhesiveness with silicon oxide layers. With larger integration of semiconductor devices, however, cells decrease in size and the conductive lines have a fine width and multilevel structure, so that deterioration of topography may be caused in the surface to form conductive lines, or step coverage becomes more significant in a curved portion such as interior part of contact holes. It means, when a conductive film is formed by sputtering aluminum or aluminum alloy to provide a conductive line, the curved portion of the conductive film is locally made thinner due to shadow effect, which is appeared severe in a contact hole that has the aspect ratio greater than unity.

Therefore, many studies have been made on another deposition techniques in place of the conventional physical deposition such as sputtering, in order to improve step coverage by depositing aluminum or aluminum alloy through chemical vapor deposition (hereinafter called CVD) that may be used to planarize the surface of a layer to be formed.

However, as the conductive line becomes extremely fine with larger integration of semiconductor devices, it is required to form the conductive line consisting of copper (Cu), gold (Au) or silver (Ag) that has higher electrical conductivity compared to aluminum or aluminum alloy. Those metals such as Cu, Au and Ag can enhance reliability of the device because they exhibit good electron migration and stress migration characteristics as well as low resistivity relative to aluminum. However, a use of halogen compounds in patterning Cu, Au or Ag to form a conductive line as conventionally used in etching aluminum involves a low etch rate owing to low vapor pressure of the halogen compounds reacted with Cu, Au or Ag. It is thus needed to raise the temperature up to about 500° C. in order to increase the vapor pressure and enhance the etch rate in etching Cu, Au or Ag with halogen compounds.

Instead of forming conductive lines consisting of Cu, Au or Ag through etch for patterning, there has been developed 'Dual Damascene' technology in which a trench is formed in the substrate and Cu, Au or Ag is then deposited therein, followed by chemical mechanical polishing (hereinafter called CMP) in such a manner that conductive lines are buried in the trench.

FIGS. 1A to 1D are cross-sectional views for illustrating a process for forming conductive lines in a semiconductor device according to a related art.

Referring to FIG. 1A, a first conductive line 13 is formed at a predetermined portion on a substrate 11. On the substrate 11 is deposited silicon oxide or silicon nitride by chemical vapor deposition (hereinafter called CVD) so as to cover the first conductive line 13, thereby forming an insulating layer 15. The substrate 11 may be an insulating layer formed on a semiconductor substrate having transistors or lower conductive lines.

Figure 1B:
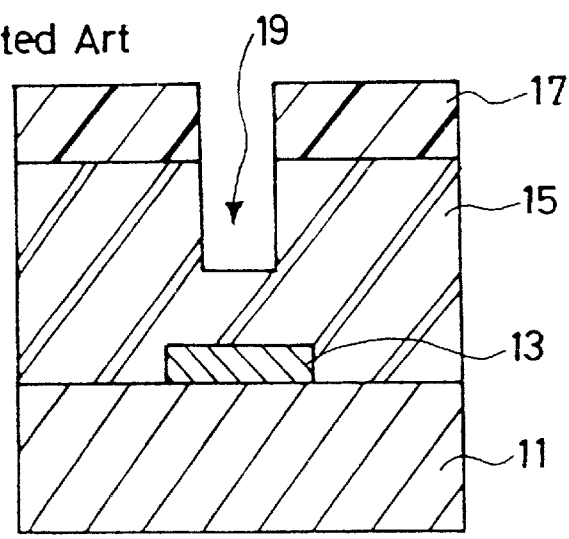

Referring to FIG. 1B, the insulating layer 15 is coated with photoresist. A first photo resist pattern 17, which exposes a portion that corresponds to a predetermined portion of the first conductive line 13 of the insulating layer 15, is formed by exposure and development to be patterned.

With the first photo resist pattern 17 used as a mask, the exposed portion of the insulating layer 15 is etched a predetermined depth by an anisotropic etching such as reactive ion etching (hereinafter called RIE) to form a first opening 19.

Figure 1C:
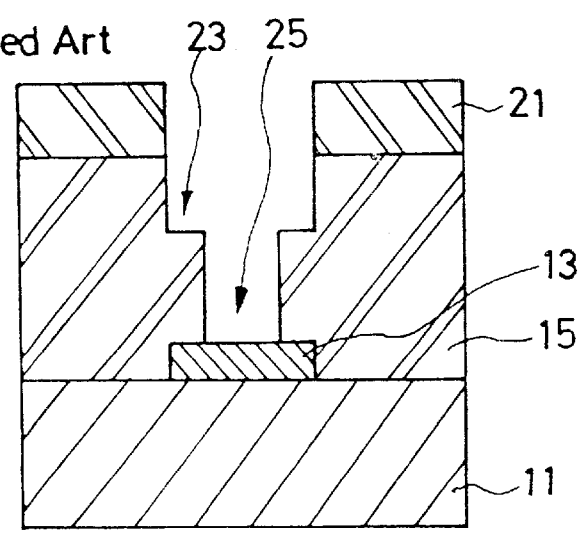

Referring to FIG. 1C, the first photo resist pattern 17 is removed to expose the insulating layer 15. The insulating layer 15 is coated with photoresist. A second photo resist pattern 21, which exposes a portion that corresponds to a predetermined portion inclusive of the first opening 19 of the insulating layer 15, is formed by exposure and development to be patterned in a strip shape (not shown).

With the second photo resist pattern 21 used as a mask, the exposed part of the insulating layer 15 undergoes an anisotropic etching such as RIE, forming a second opening 23 in the form of a trench. At this stage, the bottom surface of the first opening 19 is also etched such that the opening 19 extends to expose the first conductive line 13. So, the first opening 19 forms a contact hole.

Figure 1D:
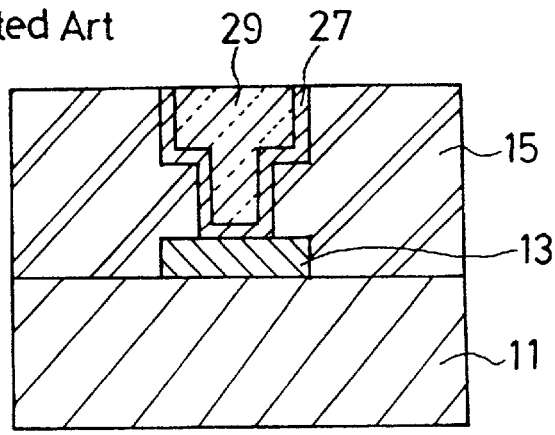

Referring to FIG. 1D, the second photo resist pattern 21 is removed and a barrier metal layer 27 being formed on the insulating layer 15 including the surfaces of the first and second openings 19 and 23 by a sputtering method. On the barrier metal layer 27 is then deposited a conductive metal by CVD to fill the first and second openings 19 and 23.

The conductive metal and the barrier metal layer 27 are subjected by CMP so as to expose the insulating layer 15 that they remain only in the first and second openings 19 and 23. The conductive metal remaining within the first and second openings 19 and 23 forms a second conductive line 29.

The related art method for forming conductive lines in a semiconductor device as described above, however, presents a problem in that the first insulating layer has a difference in thickness between the portion in which the first opening is formed and the rest having no opening formed therein, causing distortion of the pattern due to halation during an exposure upon the second photo resist pattern. Additionally, the photo resist pattern charged in the first opening is difficult to remove when patterning the second photo resist, so that an increase in the contact resistance may occur since the area of the fist conductive line exposed through the first opening extended in formation of the second opening becomes reduced.

SUMMARY OF THE INVENTION

Accordingly, an objective of the present invention is to provide a method for forming conductive lines in a semiconductor device in which halation is avoidable when patterning a second photo resist to form a second opening, thereby enhancing reliability of the device.

Another objective of the present invention is to provide a method for forming conductive lines in a semiconductor device, in which a decrease in the exposed area of a first conductive line due to extension of a first opening is avoided, and thereby, contact resistance is not increased.

To achieve the first object of the present invention, a semiconductor device includes: a method for forming conductive lines in a semiconductor device includes the steps of: (a) forming a first conductive line on a substrate; (b) forming a first insulating layer on the substrate as well as on the first conductive line; (c) etching the first insulating layer on the first conductive line to form a first opening; (d) forming a second insulating layer on the first insulating layer to be in contact with the upper part of the first opening, thereby sealing the first opening; (e) etching the first and second insulating layers corresponding to the first conductive line to form a second opening and at the same time extend the first opening so as to expose the first conductive line; and (f) forming a second conductive line within the first and second openings so as to be connected with the first conductive line.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIGS. 1A to 1D are cross-sectional views for illustrating a process for forming conductive lines in a semiconductor device according to a related art; and FIGS. 2A to 2E are cross-sectional views for illustrating a process for forming conductive lines in a semiconductor device according to the present invention.

DETAILED DESCRIPTION OF PREFERRED EMBODIMENT

Hereinafter, the present invention will be described in detail with reference to the accompanying drawings.

FIGS. 2A to 2E are cross-sectional views for illustrating a process for forming conductive lines in a semiconductor device according to the present invention.

Figure 2A:
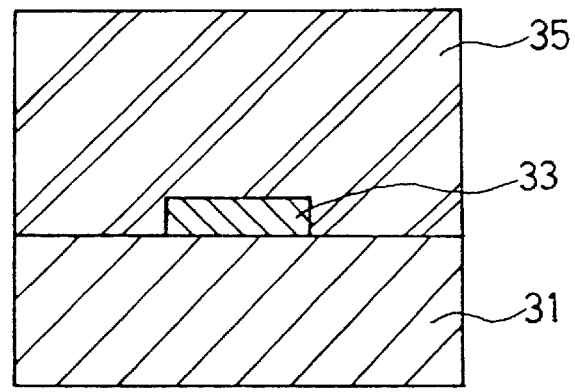

Referring to FIG. 2A, a conductive material is deposited on a substrate 31 and patterned by a photolithography to form a first conductive line 33. The substrate 31 may be an insulating layer formed on a semiconductor substrate having transistors formed thereon or lower conductive lines. The first conductive line 33 which may be gate, bit line or another conductive line consists of polysilicon, policide, silicide, conductive metal, conductive metal compound, or the like.

0.8 to 2 μm thick silicon oxide or silicon nitride is deposited on the substrate 31 by a CVD method to cover the first conductive line 33, thereby forming a first insulating layer 35.

Figure 2B:
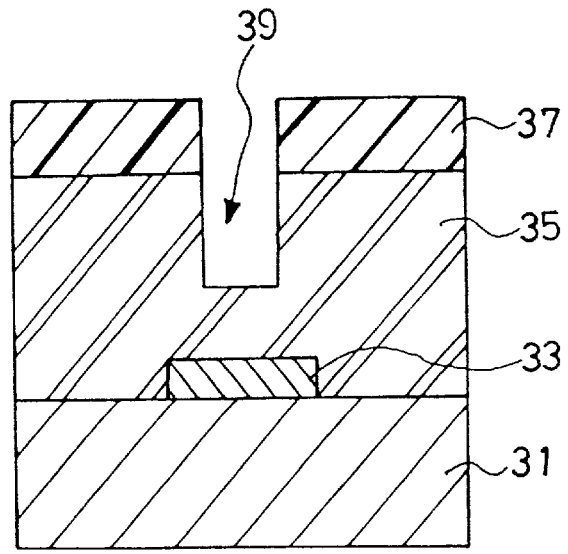

Referring to FIG. 2B, the insulating layer 35 is coated with photoresist. A first photo resist pattern 37, which exposes a portion that corresponds to a predetermined portion of the first conductive line 33 of the insulating layer 35, is formed by exposure and development to be patterned.

With the first photo resist pattern 37 being used as a mask, the exposed portion of the insulating layer 35 is etched to form a first opening 39. The first opening 39 is formed by etching the insulating layer 35 in the 400 to 12000 Å range of depth by an anisotropic etching such as RIE using $CF_4$, $C_2F_5$ or $CHF_3$ as an etching gas.

Figure 2C:
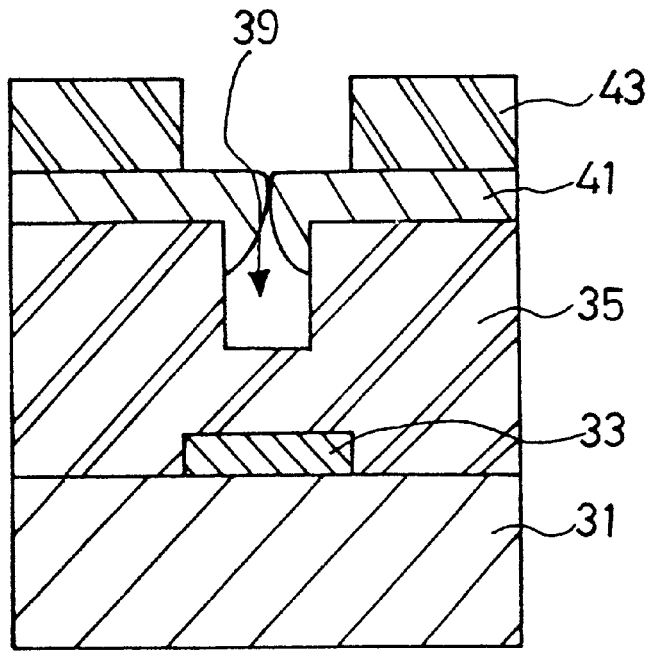

Referring to FIG. 2C, the first photo resist pattern 37 is removed to expose the surface of the insulating layer 35. A second insulating layer 41 2000 to 4000 Å thick, of which step coverage is poor, is formed by depositing silicon oxide on the first insulating layer 35. In such a case, the second insulating layer 41 causes overhangs at the upper edge of the first opening 39 and the overhangs get in contact with one another to seal the first opening 39. Thus the second insulating layer 41 causes voids to form inside the first opening 39 and thereby becomes planarized in the surface. The second insulating layer 41 may be formed through a plasma enhanced chemical vapor deposition (hereinafter called PECVD) using $SiH_4$ or TEOS (tetraethyl orthosilicate) as a reactive gas, or a sputtering method.

Subsequently, the insulating layer 35 is coated with photoresist. A second photo resist pattern 43, which exposes a portion that corresponds to a predetermined portion inclusive of the first opening 39 of the insulating layer 35, is formed by exposure and development to be patterned in a strip shape (not shown).

The second insulating layer 41 exposed as patterning the second photo resist 43 must be larger in width than the first opening 39. The second insulating layer 41 has overhangs that seal the first opening 39, so that entrance of a photo resist material into the first opening 39 is avoidable when applying the second photo resist 43 onto the second insulating layer 41. In addition, the second insulating layer 41 has less difference in thickness between the portion corresponding to the first opening 39 and the rest and becomes planarized. This suppresses occurrence of halation caused by thickness difference of the photo resist during exposure of the photo resist 43, which results in the pattern of good quality.

Figure 2D:
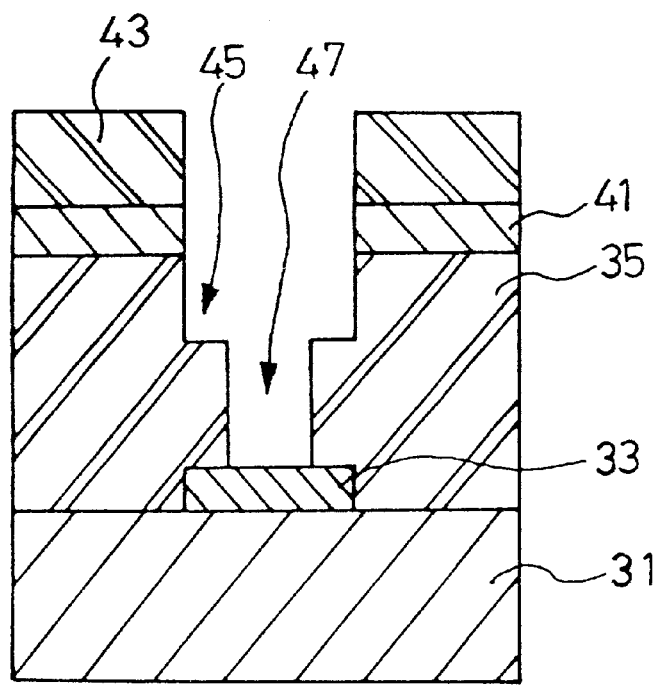

Referring to FIG. 2D, using the second photo resist 43 as a mask, the exposed part of the second insulating layer 41 and the first insulating layer 35 undergo an anisotropic etching, such as RIE using $CF_4$, $C_2F_5$ or $CHF_3$ as an etching gas. This forms a second opening 45 in the form of a trench having a strip shape (not shown) and extends the first opening 39, which exposes the first conductive line 33. That is, the first opening 39 as well as the upper surface of the first insulating layer 35 is exposed as etching the second insulating layer 41, and the bottom surface of the exposed first opening 39 is also etched when the second opening 45 is exposed by etching the exposed upper surface of the first insulating layer 35. This causes the first opening 39 to extend such that the first conductive line 33 gets exposed. It is possible to prevent reduction of the area of the first conductive line 33 exposed due to extension of the first opening 39, since there is no photo resist material remaining inside the first opening 39 having a void form.

Figure 2E:
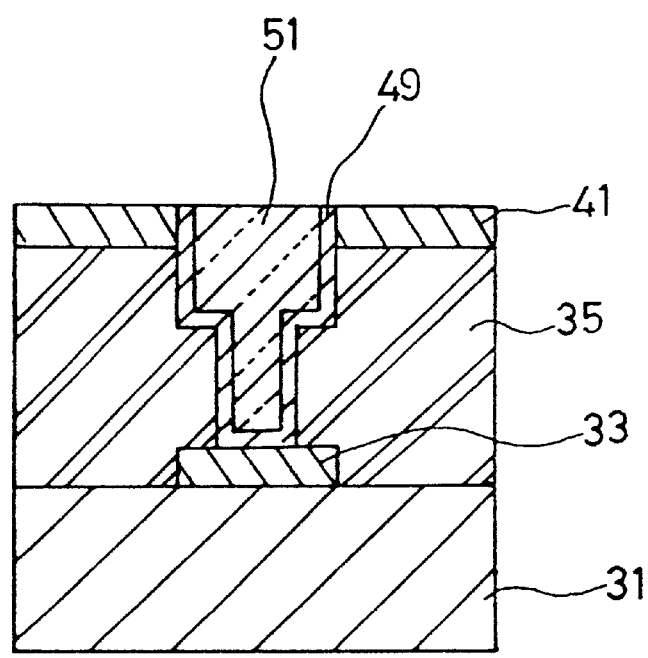

Referring to FIG. 2E, the second photo resist 43 is removed and a barrier metal layer 49 being formed on the first and second insulating layers 35 and 41 including the surfaces of the first and second openings 39 and 45. The barrier metal layer 49 is formed from titanium (Ti) and titanium nitride (TiN) continuously deposited in the 500 to 1000 Å range of thickness by a sputtering method so as to be brought in contact with the first conductive line 33. It suppresses possible diffusion of a material forming a second conductive line 51 towards the first and second interlevel insulating layers 35 and 41.

On the barrier metal layer 49 is deposited a conductive metal such as aluminum (Al), copper (Cu) or silver (Ag) by CVD to fill the first and second openings 39 and 45. And, the conductive metal and the barrier metal layer 27 formed on the second insulating layer 41 are subjected by CMP so as to be left only in the first and second openings 39 and 45. The conductive metal remaining in the first and second openings 39 and 45 forms the second conductive line 29.

In addition, the height of the device can be reduced by removing the second insulating layer 41 during formation of the second conductive line 51.

Such as in the present invention method for forming conductive lines in a semiconductor device as described above, overhangs are produced at the edge of the first opening due to poor step coverage on the first insulating layer having the first opening, wherein overhangs get in contact with one another to seal the first opening and the second insulating layer has its surface planarized. Following formation of the second insulating layer, the second photo resist is applied and patterned through exposure and development for the purpose of use as a mask in forming the trench-shaped second opening, exposing the first conductive line through the first opening.

Accordingly, the present invention presents advantages in that halation caused by irregular reflection during exposure on the second photo resist because the second insulating layer has a less difference in thickness between the portion corresponding to the first opening and the rest having no opening formed therein. Furthermore, the second insulating layer seals the upper part of the first opening such that no photo resist material remains inside the first opening during application of the second photo resist, which prevents a decrease in the exposed area of the first conductive line caused by extension of the first opening, thereby inhibiting contact resistance from being increased.

It will be apparent to those skilled in the art that various modifications and variations can be made in the method for forming conductive lines of a semiconductor device according to the present invention without departing from the spirit or scope of the invention. Thus, it is intended that the present invention cover the modifications and variations of this invention provided they come within the scope of the appended claims and their equivalents.

What is claimed is:

1. A method for forming conductive lines in a semiconductor device comprising the steps of:
    (a) forming a first conductive line on a substrate;
    (b) forming a first single insulating layer on the substrate as well as on the first conductive line;
    (c) etching the first single insulating layer on the first conductive line to form a first opening;
    (d) forming a second insulating layer on the first single insulating layer to be in contact with the upper part of the first opening, thereby sealing the first opening and defining a void at a lower part of the first opening;
    (e) etching the first single and second insulating layers corresponding to the first conductive line to form a second opening and at the same time extend the first opening so as to expose the first conductive line; and
    (f) forming a second conductive line within the first and second openings so as to be connected with the first conductive line.

2. The method as claimed in claim 1, wherein the step (c) of forming the first opening comprises the steps of:
    forming a first photo resist on the first single insulating layer to expose a portion corresponding to a portion of the first conductive line; and
    etching the first single insulating layer as deep as a predetermined depth by using the first photo resist as a mask.

3. The method as claimed in claim 1, wherein the second insulating layer is deposited to have overhangs occurring at the upper edge of the first opening and being in contact with one another to seal the first opening.

4. The method as claimed in claim 3, wherein the second insulating layer is formed by a plasma enhanced chemical vapor deposition using $SiH_4$ or TEOS (tetraethyl orthosilicate) as a reactive gas, or by a sputtering method.

5. The method as claimed in claim 1, wherein the step (e) of forming the second opening comprises the steps of:
    forming a second photo resist on the second insulating layer so as to expose a portion including a portion corresponding to the first opening; and
    etching the first single and second insulating layers by using the second photo resist as a mask.

6. The method as claimed in claim 5, wherein the second opening is wider than the first opening.

7. The method as claimed in claim 1, wherein the step (f) of forming the second conductive line comprises the steps of:
    depositing the second conductive line on the second insulating layer to fill the first and second openings; and
    performing an etch back upon the second conductive line so as to expose the second insulating layer.

8. The method as claimed in claim 7, further comprising the steps of removing the second insulating layer.

9. The method as claimed in claim 1, further comprising the steps of forming a barrier metal layer on the surface of the first and second openings.

10. The method as claimed in claim 9, wherein the barrier metal layer is formed by continuously depositing titanium (Ti) and titanium nitride (TiN) by a sputtering method.

11. The method as claimed in claim 9, wherein the step (f) of forming the second conductive line comprises the steps of:
    depositing a conductive material on the barrier metal layer to fill the first and second openings; and
    performing an etch back upon the conductive material and the barrier metal layer so as to expose the second insulating layer.

* * * * *